(12) United States Patent
Randolph et al.

(10) Patent No.: US 7,561,457 B2
(45) Date of Patent: Jul. 14, 2009

(54) SELECT TRANSISTOR USING BURIED BIT LINE FROM CORE

(75) Inventors: Mark Randolph, San Jose, CA (US);
Zhizheng Liu, San Jose, CA (US);
Ashot Melik-Martirosian, Sunnyvale, CA (US); Yi He, Fremont, CA (US);
Shankar Sinha, Redwood Shores, CA (US)

(73) Assignee: Spansion LLC, Sunnyvale, CA (US)

( * ) Notice: Subject to any disclaimer, the term of this patent is extended or adjusted under 35 U.S.C. 154(b) by 347 days.

(21) Appl. No.: 11/465,701

(22) Filed: Aug. 18, 2006

(65) Prior Publication Data

US 2008/0123384 A1    May 29, 2008

(51) Int. Cl.
*G11C 17/00*    (2006.01)
(52) U.S. Cl. .................. 365/104; 365/63; 365/129; 365/185.26
(58) Field of Classification Search ............... 365/104, 365/185.26, 63, 129
See application file for complete search history.

(56) References Cited

U.S. PATENT DOCUMENTS

| 6,060,564 | A  | * | 5/2000  | Uchida et al. | ............... | 525/263 |
| 6,509,232 | B1 | * | 1/2003  | Kim et al.    | ............... | 438/264 |
| 6,577,536 | B1 | * | 6/2003  | Chung et al.  | ............ | 365/185.11 |
| 7,154,765 | B1 | * | 12/2006 | Chen          | ............... | 365/94 |

OTHER PUBLICATIONS

2002 IEEE International Solid-State Circuits Conference, Session 6, "SRAM and Non-Violatile Memories," Feb. 4, 2004,6 pages.
2002 IEEE International Solid-State Circuits Conference, 23 pages.

* cited by examiner

*Primary Examiner*—Pho M. Luu
(74) *Attorney, Agent, or Firm*—Harrity & Harrity, LLP

(57) ABSTRACT

A semiconductor device includes a core memory array and a periphery area. The core memory array area includes a group of memory cells. The periphery area includes a group of select transistors. The select transistors are formed at substantially the same pitch as the memory cells in the core memory array and with substantially the same channel length.

17 Claims, 8 Drawing Sheets

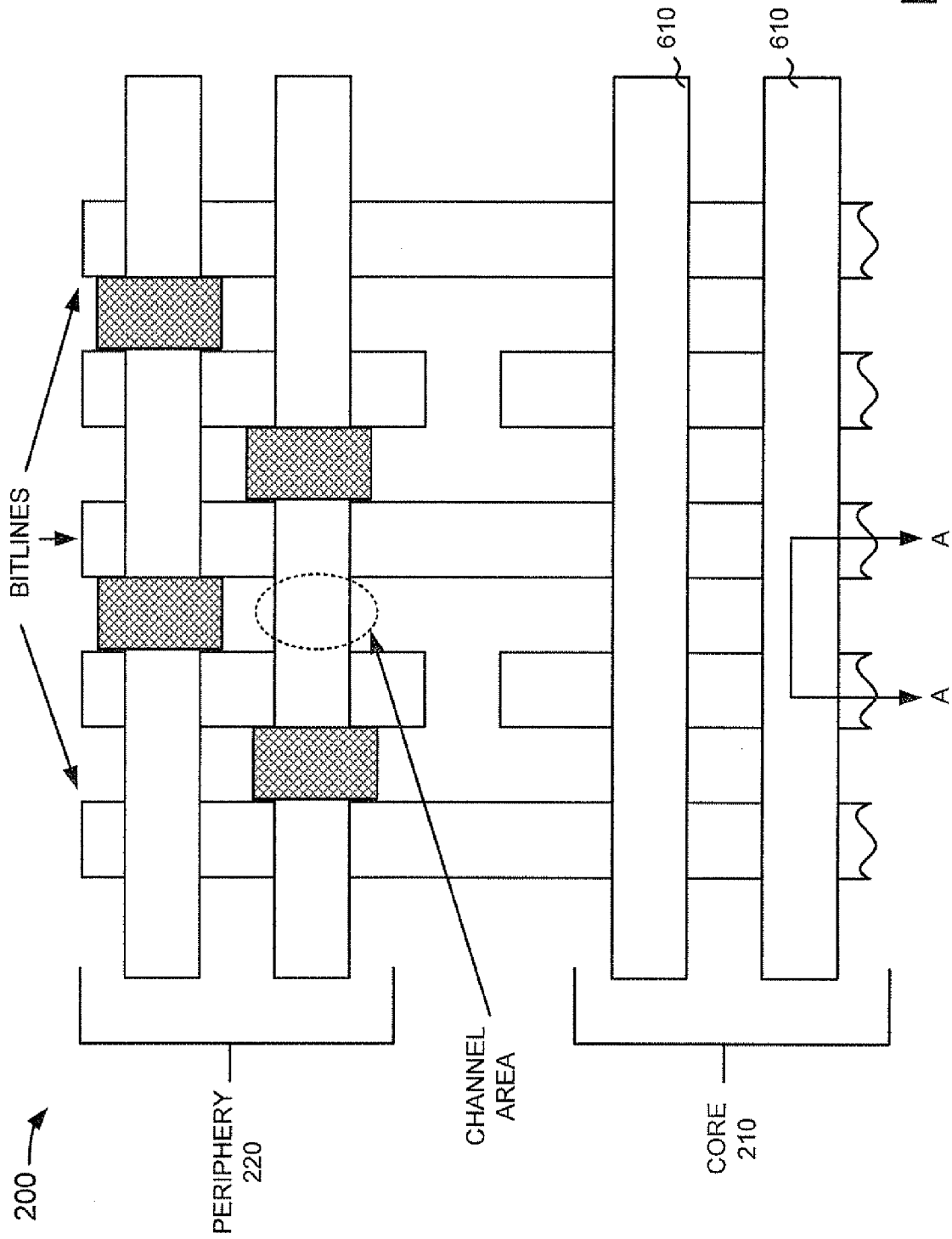

SELECT TRANSISTOR USING BURIED BIT LINE FROM CORE

FIELD OF THE INVENTION

Implementations consistent with the principles of the invention relate generally to semiconductor devices and methods of manufacturing semiconductor devices. The invention has particular applicability to non-volatile memory devices.

BACKGROUND OF THE INVENTION

The escalating demands for high density and performance associated with non-volatile memory devices require small design features, high reliability and increased manufacturing throughput. As such, designers continually search for ways to save space on the semiconductor wafer.

Non-volatile memory devices may include a core memory array area where memory cells are formed and a periphery area where periphery (or select) transistors are formed. The select transistors in the periphery area are not commonly formed at the tight pitch at which the memory cells in the core memory array area are formed. As a result, the select transistors are commonly stacked, which consumes valuable space on the semiconductor wafer. Moreover, a transition interface is needed between the select transistors and the core memory array. The transition interface also consumes value space on the semiconductor wafer.

SUMMARY OF THE INVENTION

In an implementation consistent with the principles of the invention, a semiconductor device includes a core memory array area and a periphery area. The core memory array area includes a group of memory cells. The periphery area includes a group of select transistors. The group of select transistors is formed at substantially the same pitch as the memory cells in the core memory array area and with substantially the same channel length as the memory cells in the core memory array area.

In another implementation consistent with the principles of the invention, a semiconductor device includes a core memory array area, a first periphery area, and a second periphery area. The core memory array area includes a group of first bit lines and a group of second bit lines. The first periphery area is located at a first end of the core memory array area. The second periphery area is located at a second end of the core memory array area. The group of first bit lines is extended from the core memory array area to the first periphery area. The group of second bit lines is extended from the core memory array area to the second periphery area. Select transistors are formed in the first and second periphery areas at substantially a same pitch as memory cells in the core memory array area.

In yet another implementation consistent with the principles of the invention, a semiconductor device includes a core memory array area and a periphery area. The core memory array area includes a group of first bit lines and a group of second bit lines. The periphery area is located on a first side of the core memory array area. The group of first bit lines is extended from the core memory array area to the periphery area. A distance between the core memory array area and the periphery area ranges from about 0 Å to about 10,000 Å.

BRIEF DESCRIPTION OF THE DRAWINGS

The accompanying drawings, which are incorporated in and constitute a part of this specification, illustrate an embodiment of the invention and, together with the description, explain the invention. In the drawings.

DETAILED DESCRIPTION

The following detailed description of implementations consistent with the principles of the invention refers to the accompanying drawings. The same reference numbers in different drawings may identify the same or similar elements. Also, the following detailed description does not limit the invention. Instead, the scope of the invention is defined by the appended claims and their equivalents.

Exemplary Processing

Figure 1:
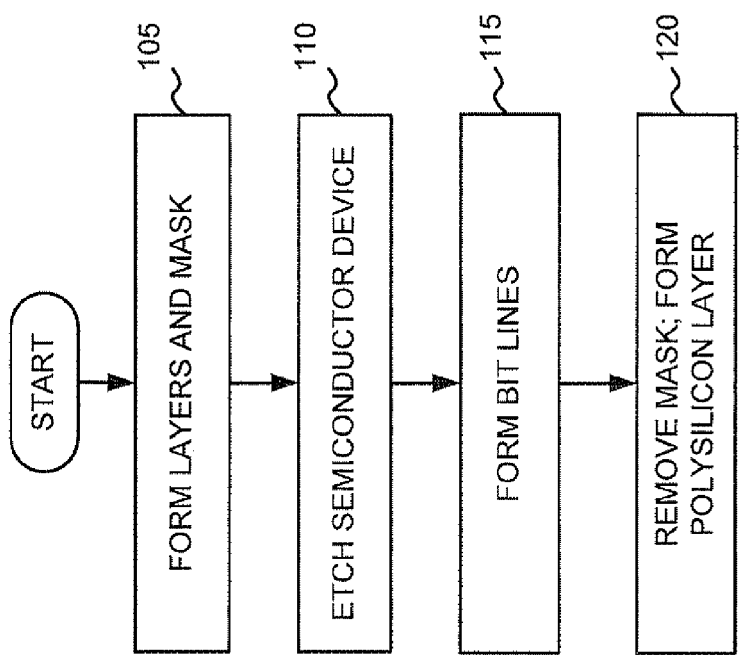
FIG. 1 illustrates an exemplary process for forming a semiconductor memory device in an implementation consistent with the principles of the invention.
Figure 2:
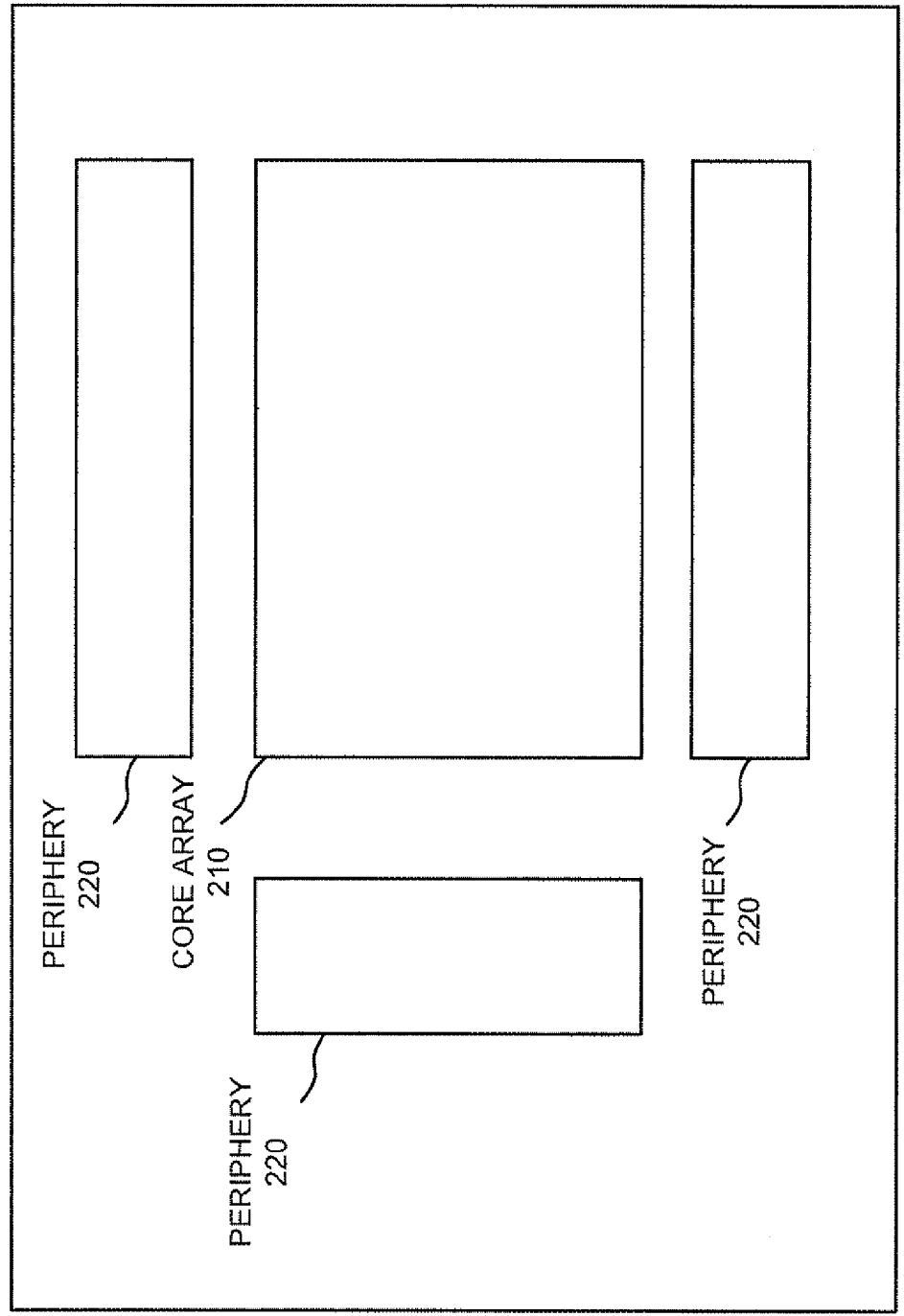
FIGS. 2-6B illustrate exemplary views of a semiconductor memory device fabricated according to the processing described in FIG. 1.

FIG. 1 illustrates an exemplary process for forming a semiconductor memory device 200 in an implementation consistent with the principles of the invention. In one implementation, semiconductor memory device 200 includes a core memory array 210 and periphery areas 220 that may include one or more select transistors, as illustrated in FIG. 2. FIGS. 3-6B illustrate exemplary views of a semiconductor memory device 200 fabricated according to the processing described in FIG. 1.

Figure 3:
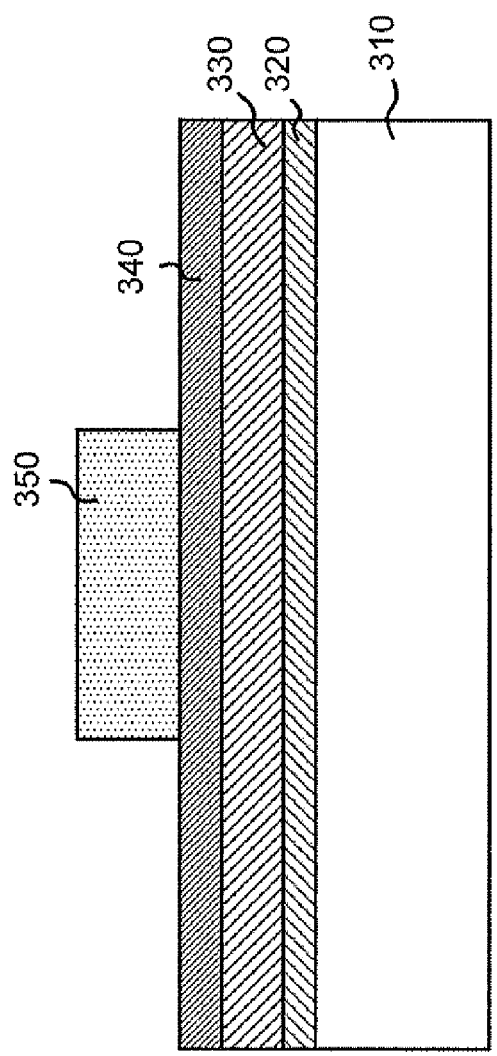

With reference to FIGS. 1 and 3, processing may begin with a semiconductor device 200 that includes a layer 310. In an exemplary embodiment, layer 310 may include a substrate of semiconductor device 200 and may include silicon, germanium, silicon-germanium or other semiconducting materials. In alternative implementations, layer 310 may be a conductive layer or a dielectric layer formed a number of layers above the surface of a substrate in semiconductor device 200.

Semiconductor device 200 may be etched to remove portions of layer 310 thereby forming shallow trenches in isolation locations in periphery area 220. The etch may also be referred to as a shallow trench isolation (STI) etch. A field oxide (FOX) layer may be deposited into the trenches to electrically isolate the select transistors that will be formed in periphery area 220. In one implementation consistent with principles of the invention, the FOX layer may be deposited by high density plasma chemical vapor deposition (HDP CVD), although suitable alternative deposition techniques may also be employed. The FOX layer may also be planarized using, for example, a chemical mechanical polishing (CMP) process to form a planar top surface.

Layers 320, 330 and 340 may be formed on semiconductor device 200, as illustrated in FIG. 3 (act 105). Layer 320 may be a dielectric layer formed on layer 310 in a conventional manner. In an exemplary implementation, dielectric layer 320 may include an oxide, such as a silicon oxide (e.g., $SiO_2$), and may have a thickness ranging from about 10 Å to about 100 Å.

Dielectric layer 320 may function as a tunnel oxide layer for a subsequently formed memory cell of semiconductor device 200.

Layer 330 may be formed on layer 320 in a conventional manner and may include a dielectric material, such as a nitride (e.g., a silicon nitride), an oxide, such as $Al_2O_3$, etc. Layer 330, consistent with an implementation of the invention, may act as a charge storage layer for semiconductor device 200 and may have a thickness ranging from about 10 Å to about 200 Å. Alternatively, layer 330 may include a conductive material, such as polycrystalline silicon, used to form a floating gate electrode for semiconductor device 200.

Layer 340 may be formed on layer 330 in a conventional manner and may include a dielectric material, such as an oxide (e.g., $SiO_2$). Alternatively, layer 340 may include another dielectric material, such as a silicon oxynitride, that may be deposited or thermally grown on layer 330. In still other alternatives, layer 340 may be a composite that includes a number of dielectric layers or films. Layer 340 may have a thickness ranging from about 10 Å to about 200 Å and may function as an inter-gate dielectric for memory cells in semiconductor device 200. Layers 320-340 may form a oxide-nitride-oxide (ONO) stack for the memory cells in semiconductor device 200.

A photoresist material may be patterned and etched to form mask 350 on the top surface of dielectric layer 340 (act 105). Mask 350 may be used to facilitate formation of one or more memory cells in core memory array area 210 and may also be used to form one or more select transistors in periphery area 220 of semiconductor device 200.

Figure 4:
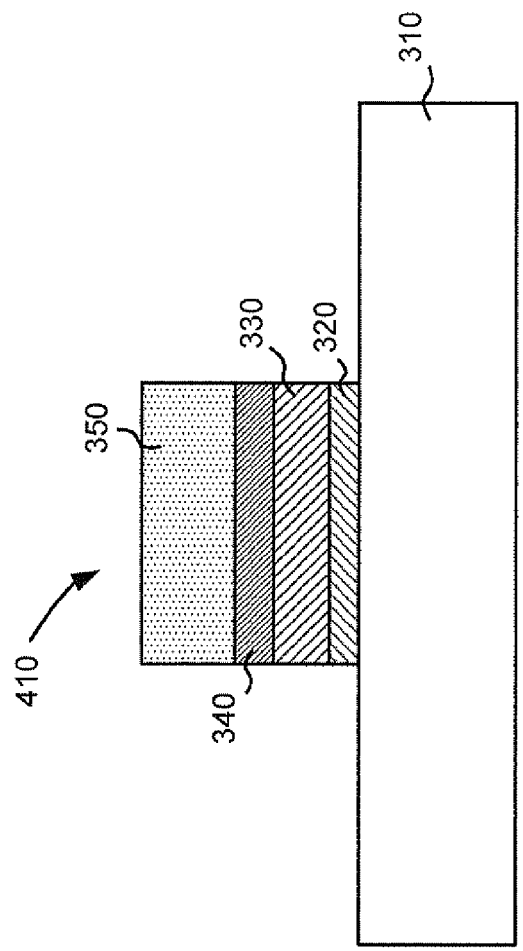

Semiconductor device 200 may then be etched, as illustrated in FIG. 4 (act 110). Referring to FIG. 4, layers 320-340 may be etched in a conventional manner with the etching terminating at substrate 310, thereby forming a structure 410. Structure 410 may form part of a memory cell of semiconductor device 200, where structure 410 includes a dielectric layer 320, a charge storage layer 330, and an inter-gate dielectric layer 340. Only one structure is illustrated in FIG. 4 for simplicity. It should be understood that semiconductor device 200 may typically include a large number of structures 410 in core memory array area 210 and periphery area 220.

Figure 5A:
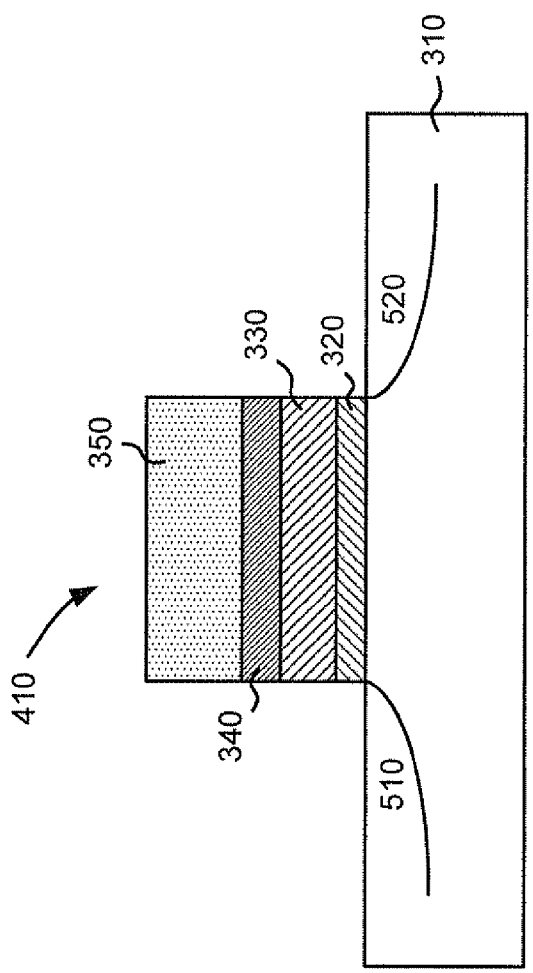

Source and drain regions 510 and 520 may be formed in substrate 310, as illustrated in FIG. 5A (act 115). For example, n-type or p-type impurities may be implanted in substrate 310 to form source and drain regions 510 and 520, based on the particular end device requirements. In one implementation, an n-type dopant, such as phosphorous or arsenic, may be implanted at a dosage ranging from about $1\times10^{14}$ atoms/cm$^2$ to about $1\times10^{17}$ atoms/cm$^2$ and an implantation energy ranging from about 0.5 KeV to about 100 KeV. Alternatively, a p-type dopant, such as boron, may be implanted at similar dosages and implantation energies. The particular implantation dosages and energy used to form source and drain regions 510 and 520 may be selected based on the particular end device requirements. One of ordinary skill in the art would be able to optimize the source/drain implantation process based on the particular circuit requirements. It should also be understood that source region 510 and drain region 520 may alternatively be formed at other points in the fabrication process of semiconductor device 200. For example, sidewall spacers may be formed prior to the source/drain ion implantation to control the location of the source/drain junctions based on the particular circuit requirements.

Figure 5B:
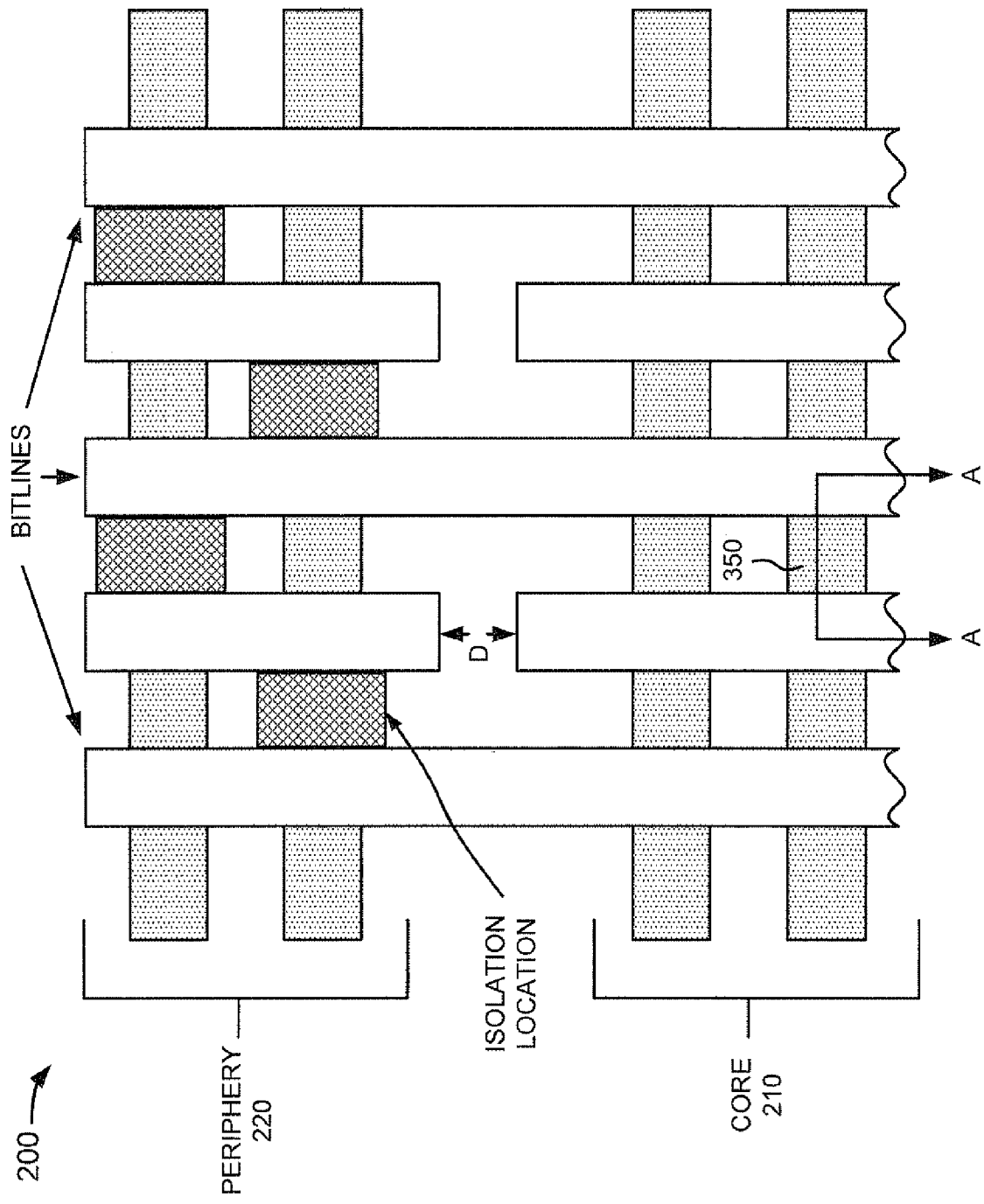

In one implementation consistent with the principles of the invention, source and drain regions 510 and 520, which form bit lines for semiconductor device 200, can be extended from core memory array area 210 to periphery area 220, as illustrated in FIG. 5B. In this way, select transistors can be formed in periphery area 220 at the same pitch as memory cells 410 of core memory array area 210 and with the same channel length (e.g., the distance between source 510 and drain 520). This allows the select transistors in periphery area 220 to scale with core memory array 210. In one implementation consistent with the principles of the invention, select bit lines from core memory array area 210 are extended to periphery area 220. For example, as illustrated in FIG. 5B, in one implementation, alternating bit lines are extended from core memory array 210 to periphery areas 220 located at each end of core memory array area 210. That is, a first bit line is extended to periphery area 220 located adjacent the top portion of core 210 and the neighboring bit line is extended to the periphery area located at the bottom of core area 210 (not shown in FIG. 5B).

In those areas of semiconductor device 200 where a bit line is not extended from core memory array area 210 to periphery area 220, a gap distance D between the bit line of core memory array 210 and the periphery area 220 may range from about the normal bit line to bit line spacing in core memory array area 210 to twice this distance. In an exemplary implementation, gap distance D may range from about 0 Å to about 10,000 Å. The cross sectional view illustrated in FIG. 5A is taken along line AA depicted in FIG. 5B.

Figure 6A:
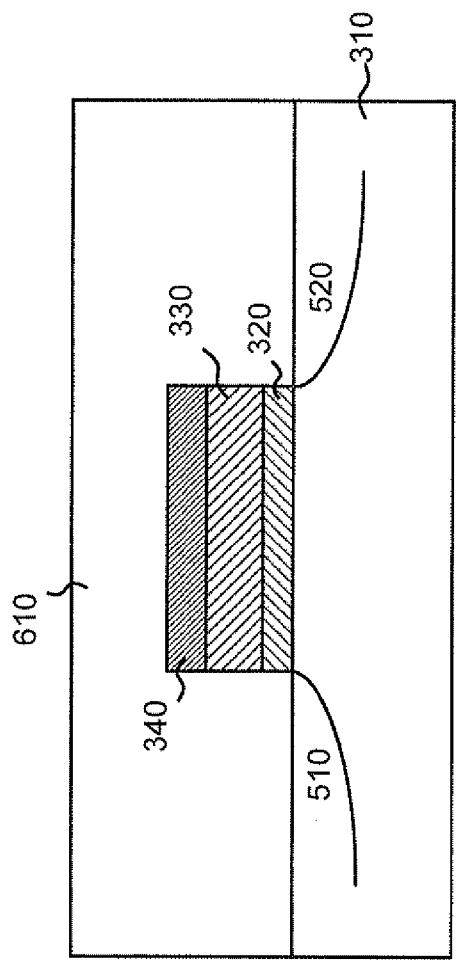

Photoresist mask 350 may be removed using a conventional process (act 120). A conductive layer 610, such as polycrystalline silicon, may be formed on semiconductor device 200, as illustrated in FIGS. 6A and 6B (act 120). Alternatively, conductive layer 610 may include other semiconducting materials, such as germanium or silicon-germanium, or various metals, such as titanium or tungsten. Conductive layer 610, consistent with the invention, may be used to form one or more control gate electrodes for one or more memory cells in semiconductor device 200 or select transistors in periphery area 220 of semiconductor device 200. An optional silicide layer, such as titanium silicide (not shown) may be formed on conductive layer 610. The cross sectional view illustrated in FIG. 6A is taken along line AA depicted in FIG. 6B.

In one implementation, the select transistors in periphery area 220 may receive the same implants as core memory array area 210 so that the select transistors match the core length and to simplify the implantation process. The channel oxide of the select transistors may, for example, be ONO (the same as core memory array area 210), a nitride-oxide (NO) stack, or a periphery oxide. If an ONO layer is used for the select transistors, it should be understood that subsequent processing will ensure that the nitride layer of the select transistor does not become charged.

Fabrication processing may then continue with the formation of various interconnects in core memory array area 210 and periphery area 220 based on the particular circuit requirements. For example, a dielectric layer (not shown) may be deposited over semiconductor device 200. The dielectric layer (also referred to an interlayer dielectric (ILD)) may act as an ILD for semiconductor device 200. The ILD may include, for example, a phosphosilicate glass (PSG) material, a boro-phosphosilicate (BSPG) material, an oxide or some other dielectric material.

The ILD may optionally be planarized using a conventional process, such as a chemical-mechanical polishing (CMP) process. The CMP process may planarize the top surface of the ILD to facilitate formation of subsequent structures, such as interconnect lines. The ILD functions to isolate various conductive structures, such as various interconnect lines (not shown), source region 510, or drain region 520 from an external electrode, etc.

For example, a trench (not shown) may subsequently be formed in the ILD using conventional photolithographic and etching techniques. The trench may be used to form a contact to, for example, source region 510 or drain region 520. Next, a metal layer, such as copper or aluminum, may be deposited to fill the trench.

An interconnect line may be formed over the planarized top surface of the ILD. For example, a metal, such as copper or aluminum, may be deposited to form an interconnect that connects various features in semiconductor device 200, such as source or drain regions 510/520 to an external electrode, to facilitate programming or erasing various memory cells 410 in semiconductor device 200.

Implementations consistent with the principles of the invention extend buried bit lines from the core memory array to the periphery area of a semiconductor device for forming select transistors. The extended bit lines may function as the source and drain of the select transistors. Using shallow trench isolation, select transistors can be formed in the periphery area on substantially the same pitch as the core memory array and with substantially the same channel length. In this way, select transistors can be formed in periphery area that scale with the core memory array and allows for the transition area (i.e., that area where the core memory array ends and the periphery area begins) to be reduced.

CONCLUSION

The foregoing description of exemplary embodiments of the invention provides illustration and description, but is not intended to be exhaustive or to limit the invention to the precise form disclosed. Modifications and variations are possible in light of the above teachings or may be acquired from practice of the invention. For example, in the above descriptions, numerous specific details are set forth, such as specific materials, structures, chemicals, processes, etc., in order to provide a thorough understanding of the invention. However, implementations consistent with the invention can be practiced without resorting to the details specifically set forth herein. In other instances, well known processing structures have not been described in detail, in order not to unnecessarily obscure the thrust of the present invention. In practicing the invention, conventional deposition, photolithographic and etching techniques may be employed, and hence, the details of such techniques have not been set forth herein in detail.

While a series of acts has been described with regard to FIG. 1, the order of the acts may be varied in other implementations consistent with the invention. Moreover, non-dependent acts may be implemented in parallel.

No element, act, or instruction used in the description of the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A semiconductor device comprising:
a core memory array area including a plurality of memory cells and a plurality of bit lines; and
a periphery area including a plurality of select transistors, the plurality of select transistors being formed at substantially a same pitch as the memory cells in the core memory array area and with substantially a same channel length as the memory cells in the core memory array area, select bit lines of the plurality of bit lings extending from the core memory array area to the periphery area,
where a distance exists between a non-select bit line and the periphery area, the distance ranging from about 0 Å to about 10,000 Å.

2. The semiconductor device of claim 1 wherein each of the select bit lines functions as a source or drain for one of the plurality of select transistors.

3. The semiconductor device of claim 1 wherein the periphery area includes a same channel oxide as the core memory array area.

4. The semiconductor device of claim 3 wherein the channel oxide includes an oxide-nitride-oxide stack.

5. The semiconductor device of claim 1 wherein a channel oxide of the core memory array area includes an oxide-nitride-oxide stack and a channel oxide of the periphery area includes a nitride-oxide stack.

6. The semiconductor device of claim 1 wherein a channel oxide of the core memory array area includes an oxide-nitride-oxide stack and a channel oxide of the periphery area includes a periphery oxide.

7. The semiconductor device of claim 1 wherein at least one select transistor in the periphery area is isolated from another select transistor via shallow trench isolation.

8. A semiconductor device comprising:
a core memory array area including a plurality of first bit lines and a plurality of second bit lines; and
a first periphery area located at a first end of the core memory array area; and
a second periphery area located at a second end of the core memory array area, the plurality of first bit lines being extended from the core memory array area to the first periphery area, the plurality of second bit lines being extended from the core memory array area to the second periphery area,
wherein select transistors in the first and second periphery areas have substantially a same pitch as memory cells in the core memory array area, and
wherein a distance between the core memory array area and the first and second periphery areas ranges from about 0 Å to about 10,000 Å.

9. The semiconductor device of claim 8 wherein memory cells in the core memory array area and select transistors in the first periphery area and the second periphery area each include an oxide-nitride-oxide stack.

10. The semiconductor device of claim 8 wherein the core memory array area includes a channel oxide-nitride-oxide stack, and
wherein select transistors in at least one of the first periphery area or the second periphery area include an oxide-nitride stack.

11. The semiconductor device of claim 8 wherein the core memory array area includes an oxide-nitride-oxide stack, and
wherein at least one of the first periphery area or the second periphery area includes an oxide.

12. The semiconductor device of claim 8 wherein bit lines in the core memory array area are alternating extended to the first and second periphery areas.

13. The semiconductor device of claim 8 wherein the first and second periphery areas each includes a plurality of select transistors, the select transistors are isolated from each other using shallow trench isolation.

14. A semiconductor device comprising:
a core memory array area including a plurality of first bit lines and a plurality of second bit lines; and a periphery area located on a first side of the core memory array area, the plurality of first bit lines being extended from the core memory array area to the periphery area, a distance between the core memory array area and the periphery area ranging from about 0 Å to about 10,000 Å.

15. The semiconductor device of claim 14 further comprising:

a second periphery area located on a second side of the core memory array area, the plurality of second bit lines being extended from the core memory array area to the second periphery area, a distance between the core memory array area and the second periphery area ranging from about 0 Å to about 10,000 Å.

16. The semiconductor device of claim 15 wherein the plurality of first bit lines alternate with the plurality of second bit lines in the core memory array area.

17. The semiconductor device of claim 15 wherein select transistors in the first periphery area and the second periphery area are formed at a same pitch as memory cells of the core memory array area.

* * * * *